(12) United States Patent
Kawashita et al.

(10) Patent No.: US 11,063,413 B2
(45) Date of Patent: Jul. 13, 2021

(54) HOUSING, ELECTRIC CONNECTION BOX AND WIRE HARNESS

(71) Applicant: YAZAKI CORPORATION, Tokyo (JP)

(72) Inventors: Kazuyuki Kawashita, Shizuoka (JP); Kotei O, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 171 days.

(21) Appl. No.: 16/443,413

(22) Filed: Jun. 17, 2019

(65) Prior Publication Data

US 2019/0386473 A1    Dec. 19, 2019

(30) Foreign Application Priority Data

Jun. 19, 2018  (JP) .............................. JP2018-115727

(51) Int. Cl.
| | |
|---|---|
| *H02G 3/08* | (2006.01) |
| *B60R 16/02* | (2006.01) |
| *B60R 16/023* | (2006.01) |
| *H01R 13/66* | (2006.01) |
| *H05K 5/02* | (2006.01) |
| *H05K 5/06* | (2006.01) |

(52) U.S. Cl.
CPC ......... *H02G 3/081* (2013.01); *B60R 16/0207* (2013.01); *B60R 16/0238* (2013.01); *H01R 13/66* (2013.01); *H02G 3/088* (2013.01); *H05K 5/02* (2013.01); *H05K 5/06* (2013.01)

(58) Field of Classification Search
CPC .......... H02G 3/08; H02G 3/081; H02G 3/088; H05K 5/00; H05K 5/02; H05K 5/0217; H05K 5/06; H05K 5/061; B60R 16/0207; B60R 16/0238; B60R 16/0222; B60R 16/0239
USPC .... 174/50, 520, 17 R, 50.5, 53, 57, 58, 135; 220/3.2–3.9, 4.02; 277/600, 640, 641, 277/642, 910; 439/535, 536
See application file for complete search history.

(56) References Cited

U.S. PATENT DOCUMENTS

| | | | | |
|---|---|---|---|---|
| 3,974,933 A | * | 8/1976 | Toth ....................... | H02G 3/088 174/50 |
| 5,050,764 A | * | 9/1991 | Voss ....................... | F16J 15/062 277/642 |
| 5,531,345 A | * | 7/1996 | Nakamura ............. | H02G 3/088 220/3.8 |
| 5,864,091 A | * | 1/1999 | Sumida .................. | H02G 3/088 174/50 |

(Continued)

FOREIGN PATENT DOCUMENTS

| | | |
|---|---|---|
| CN | 1177225 A | 3/1998 |
| CN | 204104255 U | 1/2015 |

(Continued)

*Primary Examiner* — Angel R Estrada
(74) *Attorney, Agent, or Firm* — Kenealy Vaidya LLP

(57) ABSTRACT

A housing includes: a case that has a first surface having an opening; a cover that covers the opening and has a second surface that is in surface contact with the first surface; and an annular packing that is disposed on an outer side of the opening. One of the first surface and the second surface has a packing groove to which the packing is attached, and a groove portion that is disposed on an outer side of the packing groove and formed on a same plane as the packing groove.

8 Claims, 12 Drawing Sheets

(56) References Cited

U.S. PATENT DOCUMENTS

| | | | | |
|---|---|---|---|---|
| 5,880,401 | A | * | 3/1999 | Leischner ................ H02B 1/28 |
| | | | | 174/17 CT |
| 6,108,202 | A | | 8/2000 | Sumida |
| 6,455,768 | B2 | * | 9/2002 | Negishi .................. H05K 5/061 |
| | | | | 174/17 CT |
| 7,208,678 | B2 | * | 4/2007 | Shinmura .......... H05K 7/20927 |
| | | | | 174/50 |
| 8,053,668 | B2 | * | 11/2011 | Lai ....................... H05K 9/0009 |
| | | | | 174/50 |
| 9,192,083 | B2 | * | 11/2015 | Moon .................... H05K 9/002 |
| 2017/0070040 | A1 | | 3/2017 | Kawada et al. |

FOREIGN PATENT DOCUMENTS

| | | |
|---|---|---|
| CN | 105101715 A | 11/2015 |
| CN | 204928549 U | 12/2015 |
| CN | 106505496 A | 3/2017 |
| DE | 9321190 U1 | 1/1998 |
| JP | 2003-101256 A | 4/2003 |
| JP | 2011-239099 A | 11/2011 |

* cited by examiner

HOUSING, ELECTRIC CONNECTION BOX AND WIRE HARNESS

CROSS-REFERENCES TO RELATED APPLICATIONS

This application is based on and claims priority from Japanese Patent Application No. 2018-115727 filed on Jun. 19, 2018, the entire contents of which are incorporated herein by reference.

FIELD

The present invention relates to a housing that includes a case, a cover and a packing, an electric connection box that includes the housing, and a wire harness that includes the electric connection box at an end portion thereof.

BACKGROUND

JP-A-2003-101256 discloses two different waterproof structures of a housing that includes: a case having an opening, and a cover that covers the opening of the case. In a first waterproof structure, a packing groove is formed around the opening of the case, and an annular first packing is attached to the packing groove. According to this structure, when the cover covers the case, the first packing is compressed, and at this time, the first packing is in close contact with both the case and the cover to prevent infiltration of water.

Next, in a second waterproof structure, a second packing is attached to an outer side of the first packing. According to this structure, the second packing is also compressed and in close contact with the case and the cover. Accordingly, a double waterproof structure of the first packing and the second packing can be obtained, and infiltration of water can be prevented more reliably. Further, in the second waterproof structure, an outer extension portion is formed on an outer periphery of the case, and the case has a stepped shape so that the outer extension portion is located below an opening position of the case in a vertical direction. Further, the second packing is attached to the outer extension portion. On the other hand, an eaves portion is formed on the cover in accordance with a position of the outer extension portion of the case. The eaves portion is formed in a stepped shape with respect to a main body portion of the cover in accordance with a step of the case. The eaves portion is formed as a portion that compresses the second packing.

SUMMARY

In the waterproof structure described above, when water as a subject of waterproofing includes, for example, salt, the following technical problems are exemplified. That is, according to the first waterproof structure, although water (salt water) is blocked by a packing, during repeated contact and drying of water, crystallization of salt proceeds and deterioration of the packing occurs, which causes a technical problem that a waterproof function (an anticorrosion function against salt) is deteriorated. In addition, since the second waterproof structure has a stepped shape and double packings, there is a technical problem that the housing is complicated, increased in size, and the number of components is increased.

The invention has been made in view of the above circumstances, and an object thereof is to provide a housing, an electric connection box and a wire harness which can be simplified and reduced in size while ensuring a waterproof and anticorrosion function.

A first aspect of the invention provides a housing that includes a case that has a first surface having an opening; a cover that covers the opening and has a second surface that is in surface contact with the first surface; an annular packing that is disposed on an outer side of the opening, in which one of the first surface and the second surface has a packing groove to which the packing is attached, and a groove portion that is disposed on an outer side of the packing groove and formed on a same plane as the packing groove.

According to the first aspect, since the groove portion is formed on the outer side of the packing groove, water that includes, for example, salt can be stored in the groove portion before reaching the packing, and as a result, crystallization of the salt can occur in the groove portion rather than in the packing. Therefore, deterioration of the packing is prevented and a waterproof function (an anticorrosion function against salt) can be maintained. Further, even if water that includes salt passes beyond the groove portion and reaches the packing, and the crystallization of the salt occurs in the packing, an occurrence of the crystallization can be delayed due to presence of the groove portion, and the deterioration of the packing which may impair the waterproof function (the anticorrosion function against salt) can be prevented. That is, the housing according to the first aspect can be provided with a waterproof structure (an anticorrosion structure) effective as a permanent measure. In addition, since the groove portion is formed on the outer side of the packing groove and on the same plane as the packing groove, the housing can be simplified and reduced in size as compared with the structure described in the background art. In addition, since a sufficient waterproof and anticorrosion function can be secured with only one packing, an increase in the number of components can be prevented, and assembly of the housing can be facilitated.

A second aspect of the invention provides the housing according to the first aspect described above which further includes a plurality of fastening members that fasten the case and the cover, in which each of the case and the cover has a plurality of fastening portions which are formed at positions on an outer side of the packing and the packing groove and to which the plurality of fastening members are fastened, respectively, and the groove portion is disposed at a position at which the plurality of fastening portions are connected.

According to the second aspect, since the groove portion is formed at the position at which the plurality of fastening portions are connected, the housing does not increase in size due to the groove portion. Therefore, it is possible to contribute to reduction in size of the housing.

A third aspect of the invention provides the housing according to the first aspect which further includes a plurality of fastening members that fasten the case and the cover, in which each of the case and the cover has a plurality of fastening portions which are formed at positions on an outer side of the packing and the packing groove and to which the plurality of fastening members are fastened, respectively, and the groove portion is disposed at a position on an inner side of the plurality of fastening portions.

According to the third aspect, since the groove portion is formed at the position on the inner side of the plurality of fastening portions, the housing does not increase in size due to the groove portion. Therefore, it is possible to contribute to reduction in size of the housing.

A fourth aspect of the invention provides the housing according to the first aspect which further includes a plurality of fastening members that fasten the case and the cover, in which each of the case and the cover has a plurality of fastening portions which are formed at positions on an outer side of the packing and the packing groove to which the plurality of fastening members are fastened, and the groove portion is disposed at a position on an outer side of and in a vicinity of the plurality of fastening portions.

According to the fourth aspect, since the groove portion is formed at the position on the outer side of and in the vicinity of the plurality of fastening portions, the housing does not increase in size due to the groove portion. Therefore, it is possible to contribute to reduction in size of the housing.

A fifth aspect of the invention provides the housing according to one of the first aspect to the fourth aspect, in which a bottom surface of the groove portion has a recessed cross-sectional shape.

According to the fifth aspect, since the groove portion has the bottom surface with the recessed cross-sectional shape, more water that includes, for example, salt can be stored.

A sixth aspect of the invention provides the housing according to one of the first aspect to the fourth aspect, in which a bottom portion of the groove portion has a through hole that communicates with an outside of the housing.

According to the sixth aspect, since the groove portion has the through hole, water that includes, for example, salt can be drained to the outside of the housing via the through hole. Therefore, since the water can be drained to the outside of the housing, it is possible to contribute to prevention of the deterioration of the packing and to maintain the waterproof function (the anticorrosion function against salt).

A seventh aspect of the invention provides the housing according to one of the first aspect to the fourth aspect, in which another of the first surface and the second surface has a protruding portion configured to be inserted into the groove portion with a gap therebetween.

According to the seventh aspect, since the protruding portion configured to be inserted into the groove portion with the gap therebetween is formed, it is possible to complicate an infiltration path of water that includes, for example, salt and to make it difficult to reach the packing.

An eighth aspect of the invention provides an electric connection box that includes the housing according to one of the first aspect to the seventh aspect and a plurality of electronic components that are housed in the housing.

According to the eighth aspect, it is possible to provide an electric connection box with a high waterproof function (an anticorrosion function).

A ninth aspect of the invention provides a wire harness that includes a wiring portion that is installed in an automobile and an end portion that includes the electric connection box according to the eighth aspect.

According to the ninth aspect, it is possible to provide a wire harness that includes an electric connection box with a high waterproof function (an anticorrosion function).

The aspects of the invention achieve an effect that a housing, an electric connection box, and a wire harness, which can be simplified and reduced in size while ensuring a waterproof and anticorrosion function, can be provided.

DETAILED DESCRIPTION

In an embodiment of the invention, an electric connection box that is provided at an end of a wire harness includes a housing and a plurality of electronic components that are housed in the housing. The housing includes a case having an opening, a cover that covers the opening, an annular packing that is disposed on an outer side of the opening, and a plurality of fastening members that fasten the case and the cover. The case has a first surface having an opening, and the cover has a second surface that is in surface contact with the first surface. One of the first surface and the second surface has a packing groove to which the packing is attached and a groove portion that is disposed on an outer side of the packing groove and formed on a same plane as the packing groove.

Figure 1:
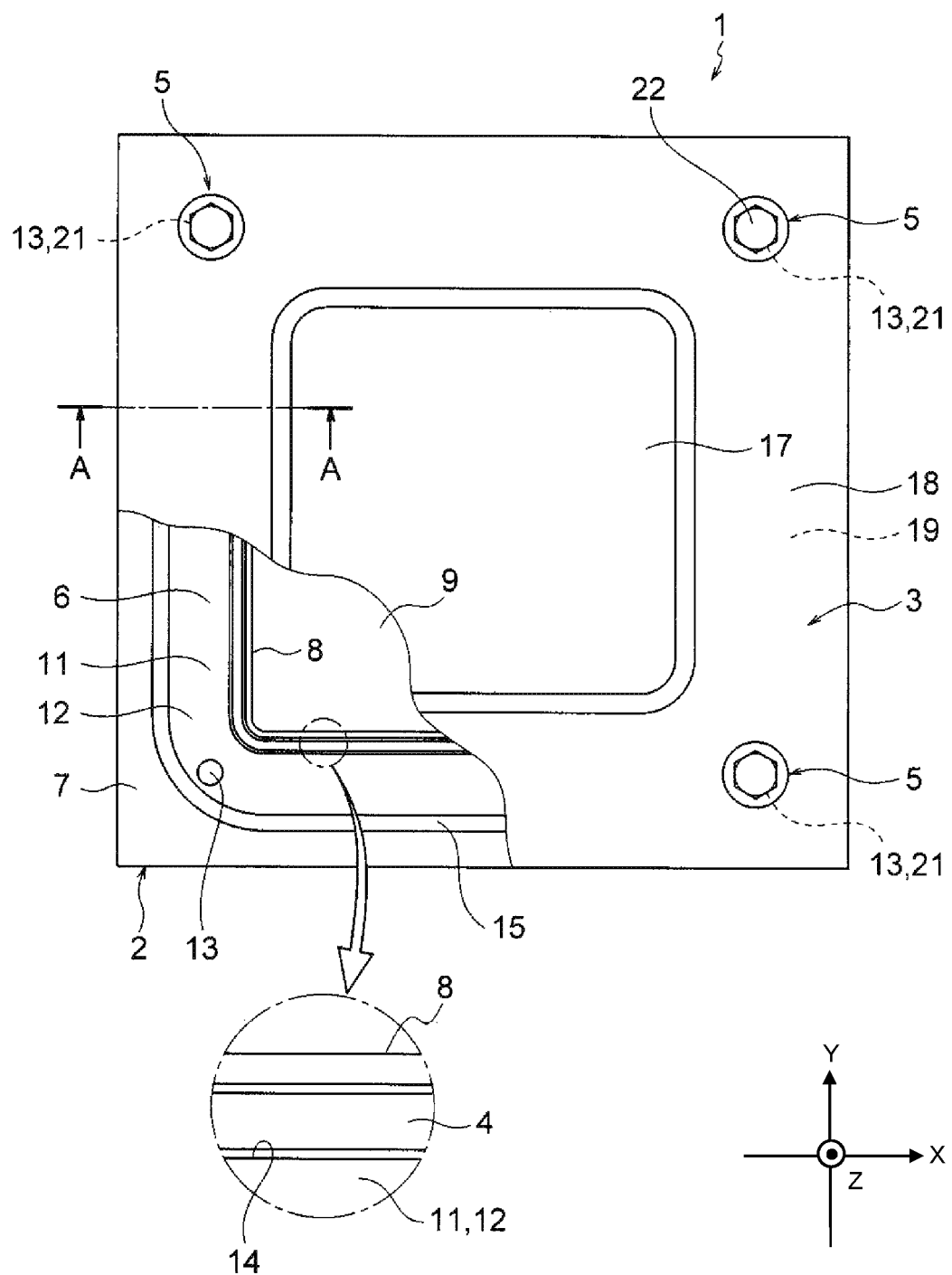
FIG. 1 is a plan view showing a first example of a housing, a groove portion and a cover according to an embodiment of the invention.
Figure 2:
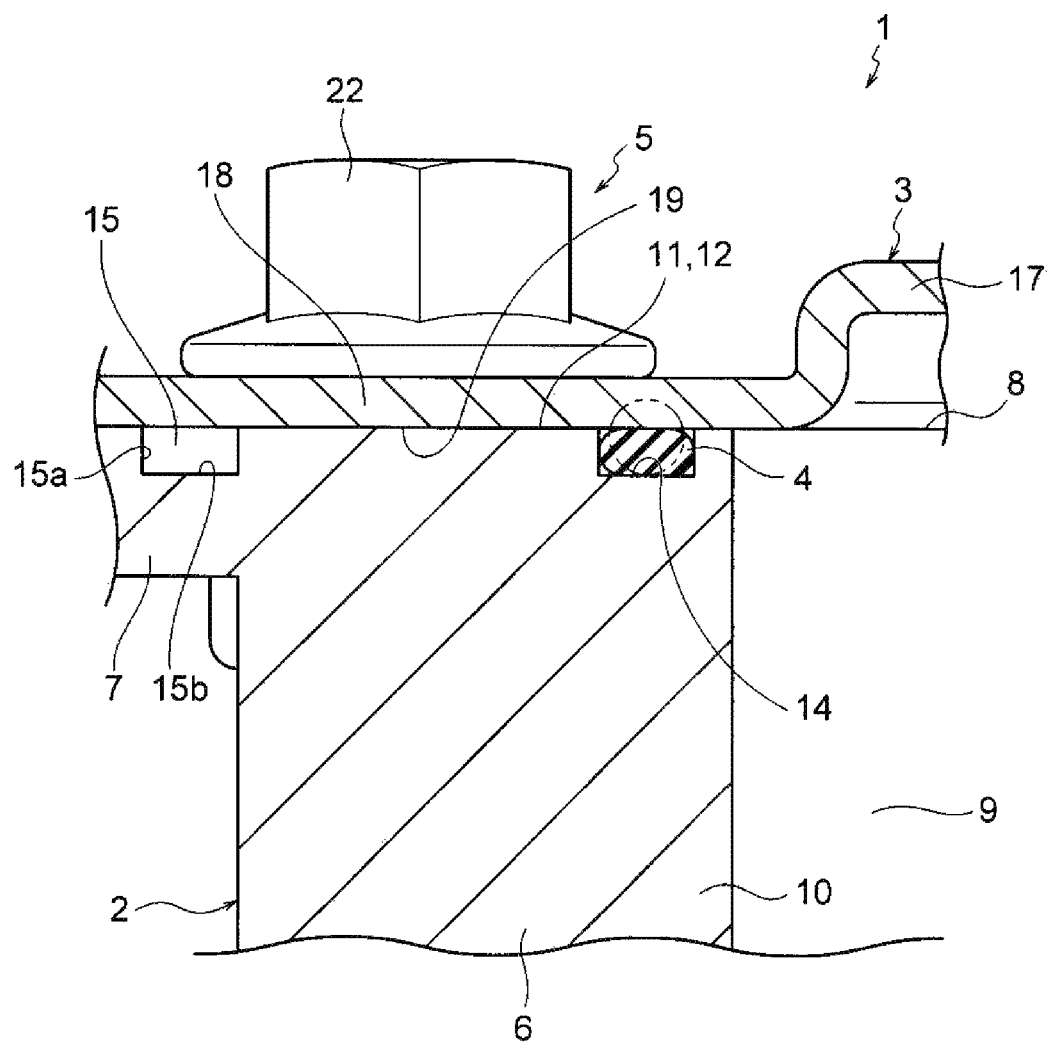
FIG. 2 is a cross-sectional view taken along a line A-A in FIG. 1.
Figure 3:
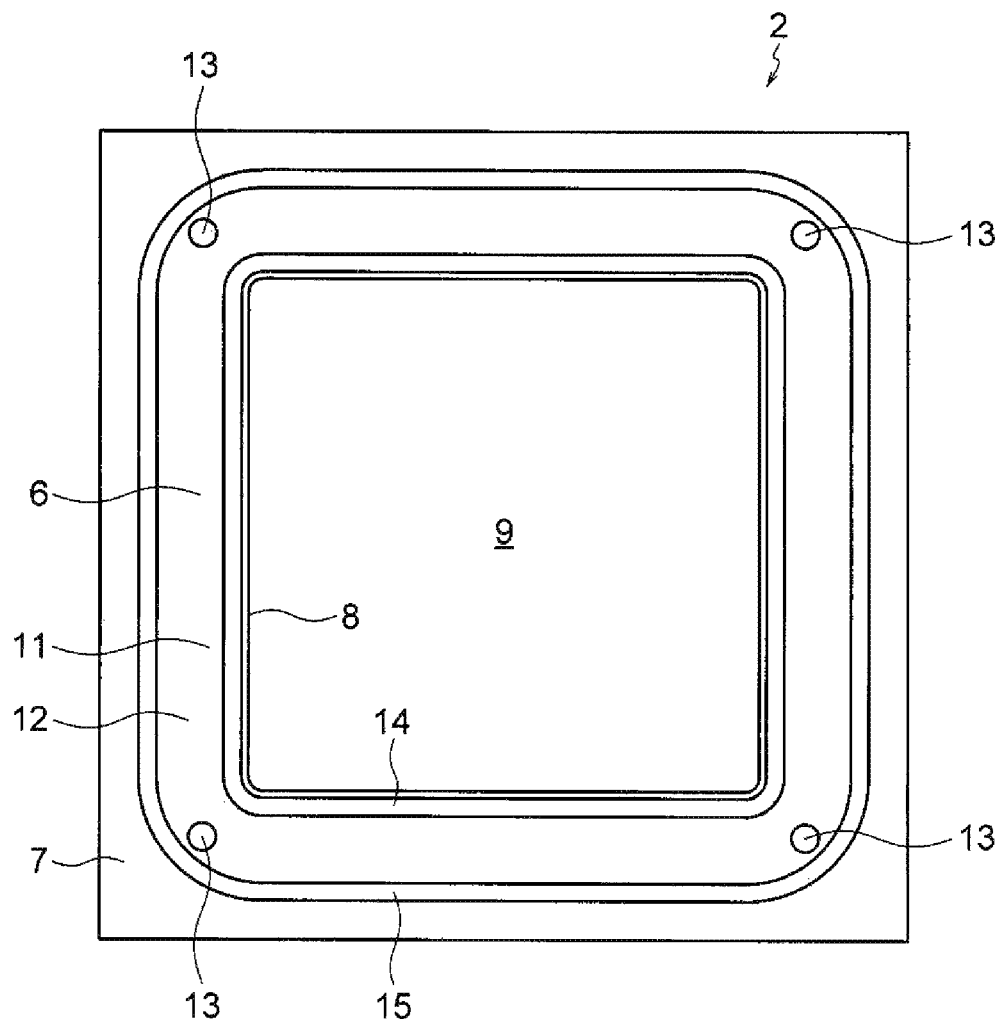
FIG. 3 is a plan view of a case in FIG. 1.
Figure 3:
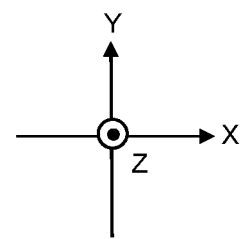
Figure 4:
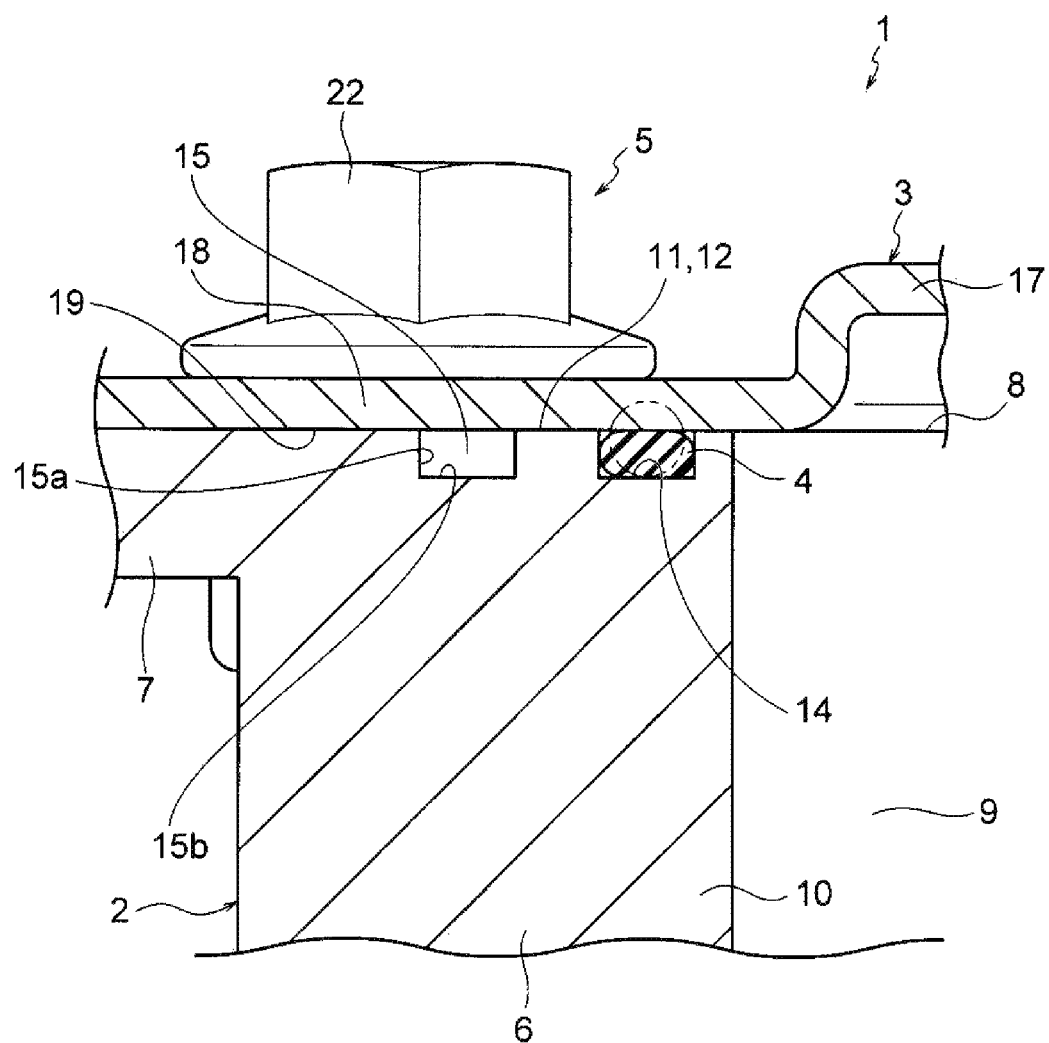
FIG. 4 is a cross-sectional view of the housing showing a second example of the groove portion.
Figure 4:
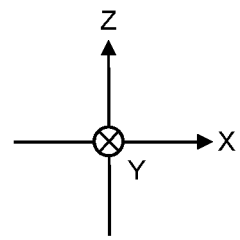
Figure 5:
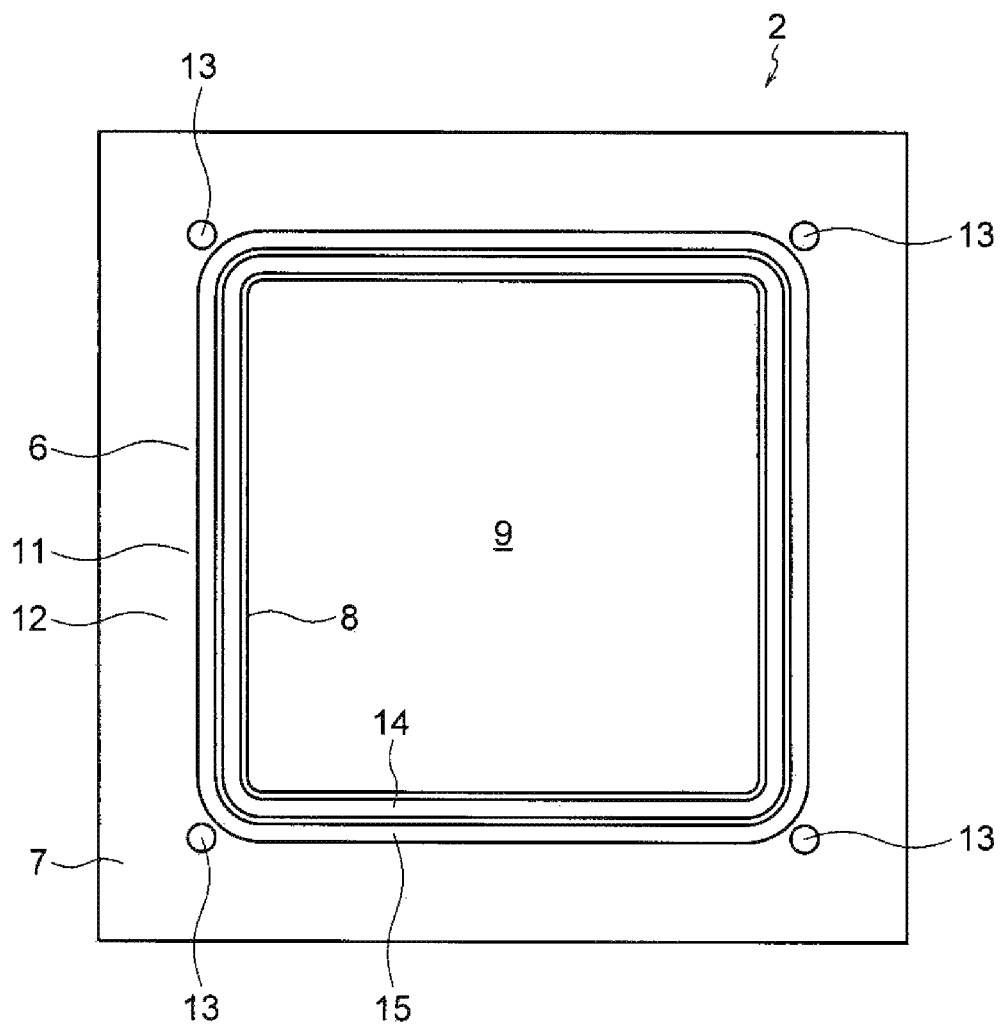
FIG. 5 is a plan view of a case in FIG. 4.
Figure 5:
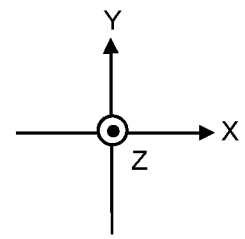
Figure 6:
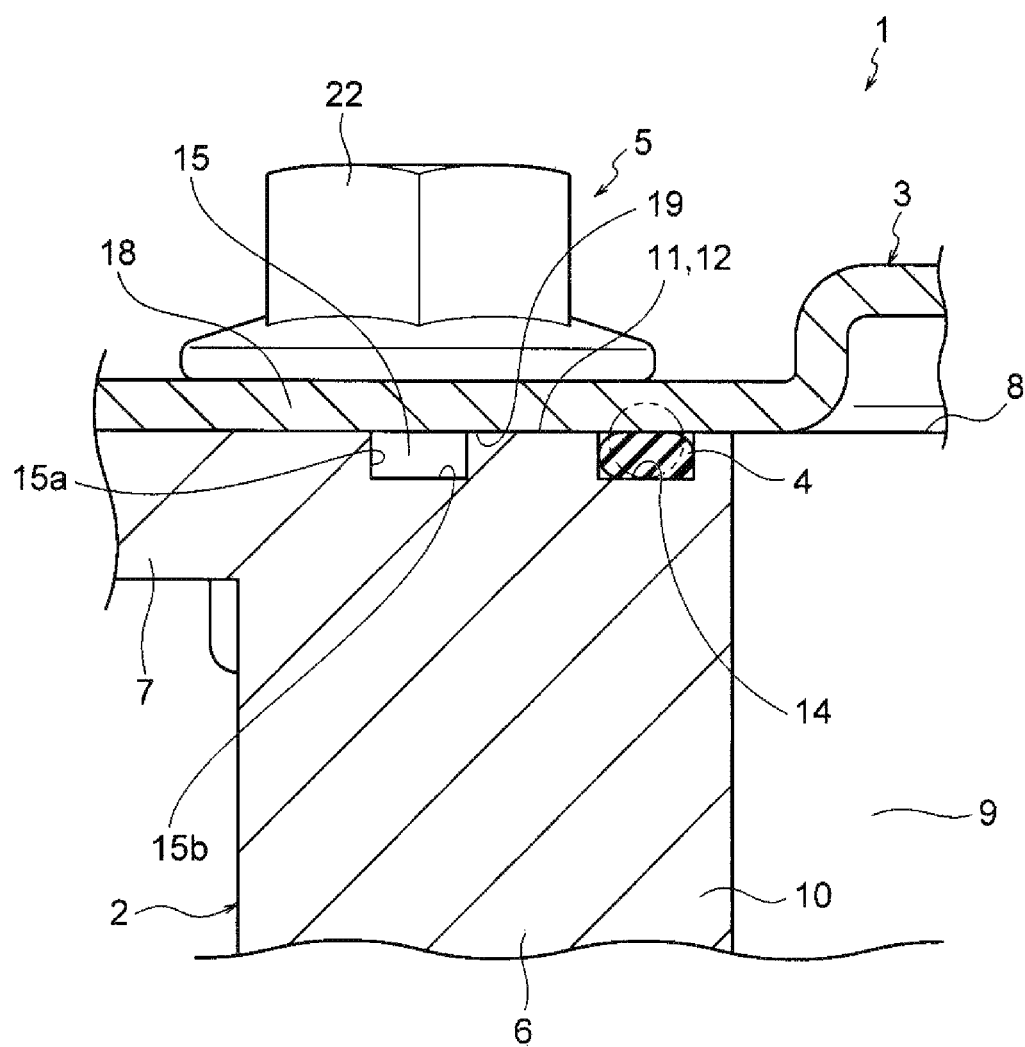
FIG. 6 is a cross-sectional view of the housing showing a third example of the groove portion.
Figure 6:
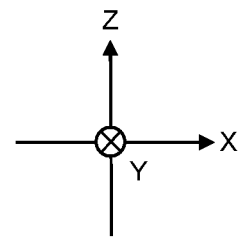
Figure 7:
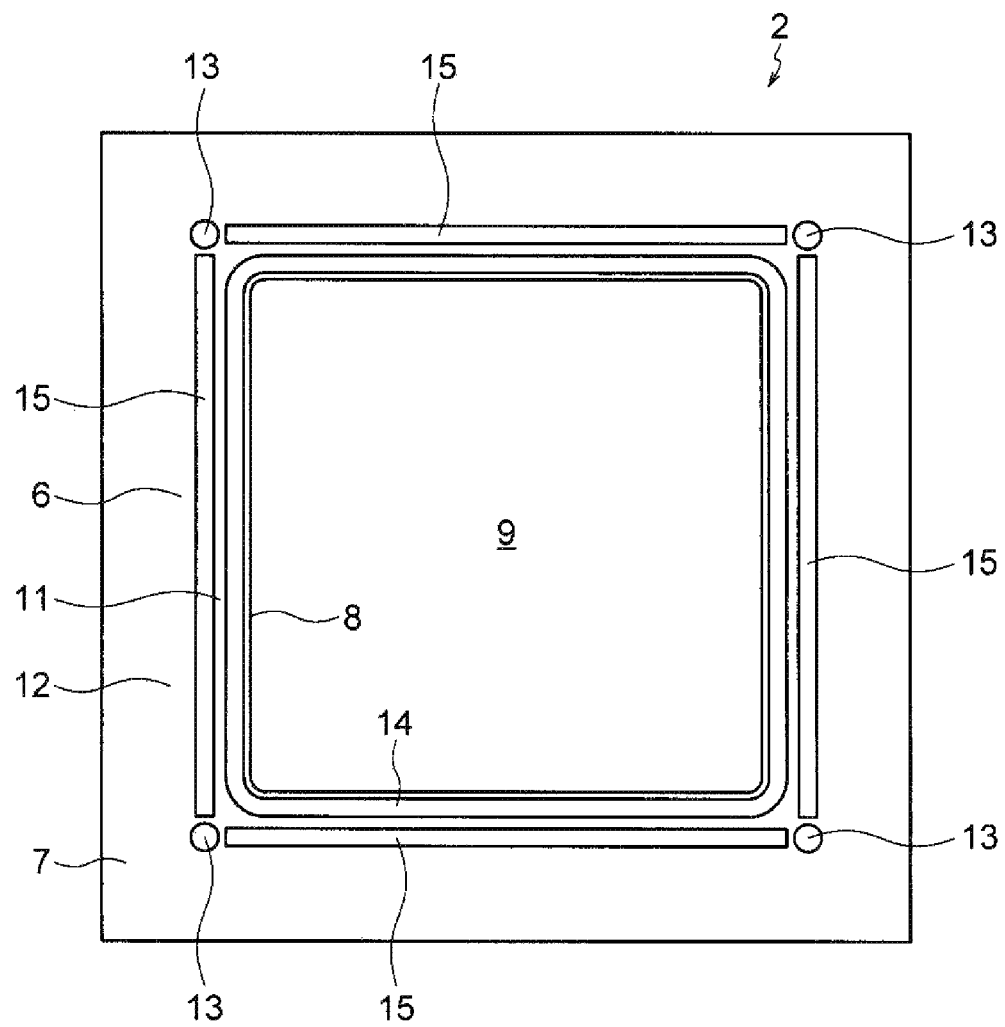
FIG. 7 is a plan view of a case in FIG. 6.
Figure 7:
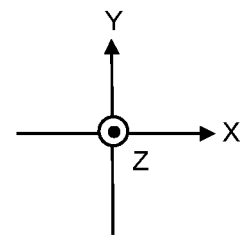
Figure 8:
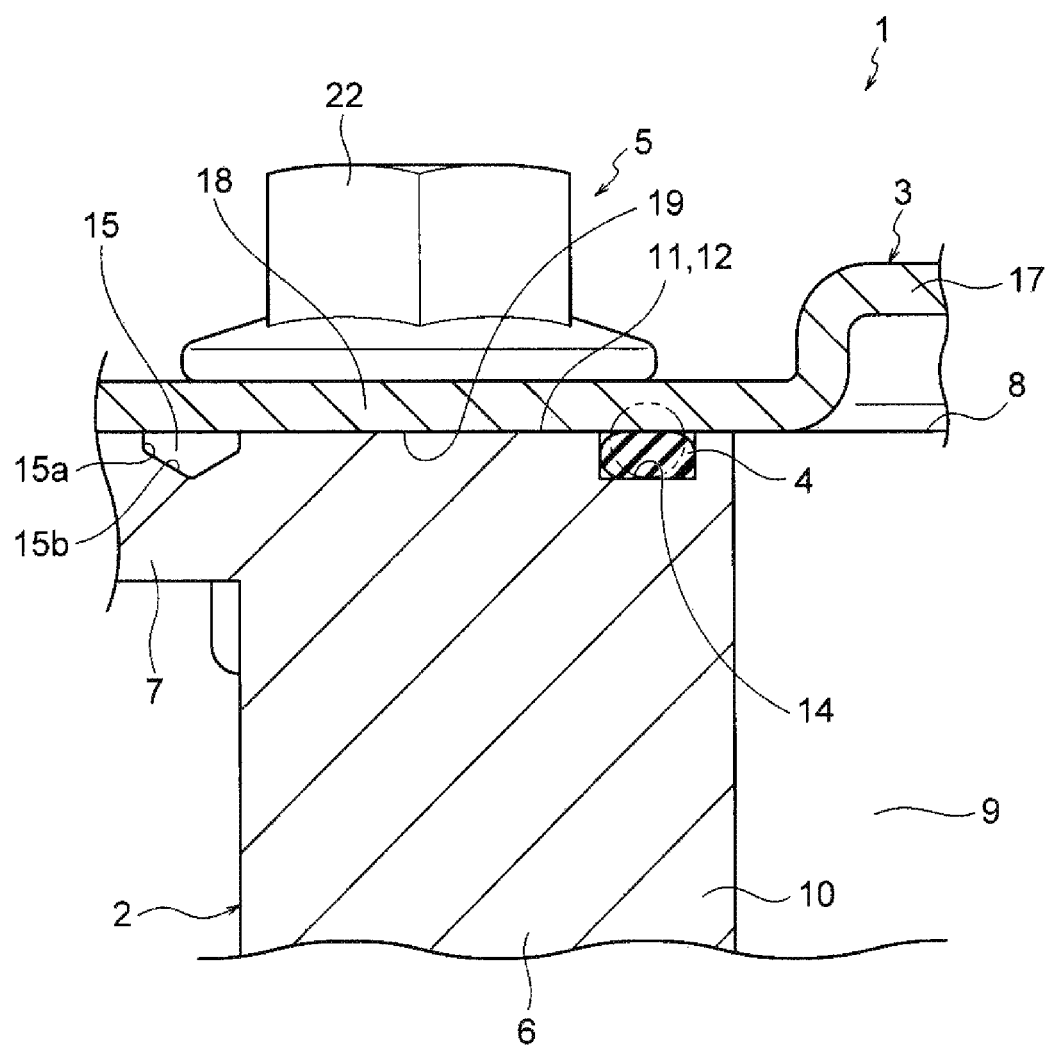
FIG. 8 is a cross-sectional view of the housing showing a fourth example of the groove portion.
Figure 8:
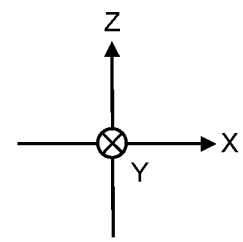
Figure 9:
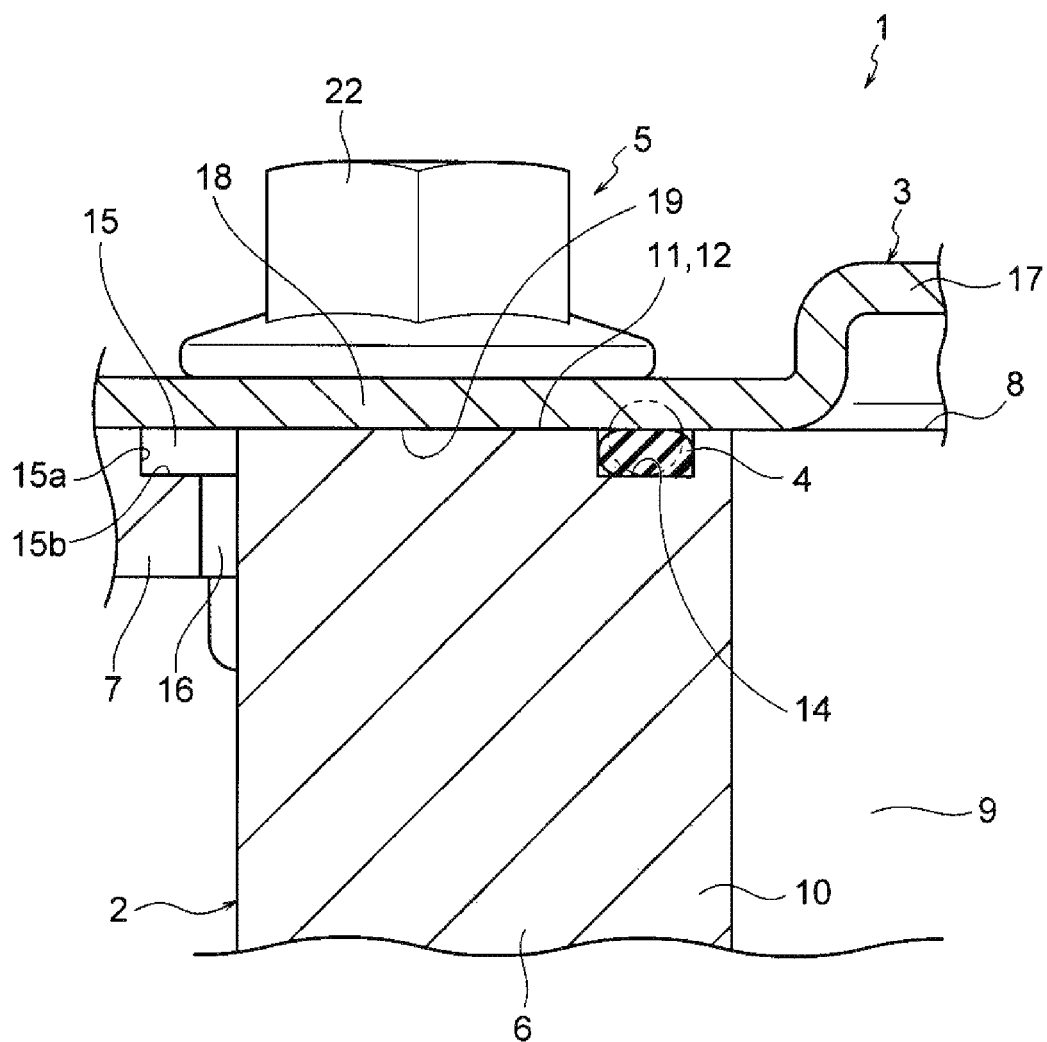
FIG. 9 is a cross-sectional view of the housing showing a fifth example of the groove portion.
Figure 9:
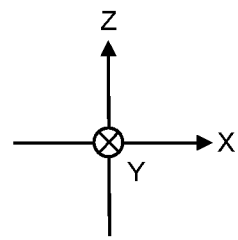
Figure 10:
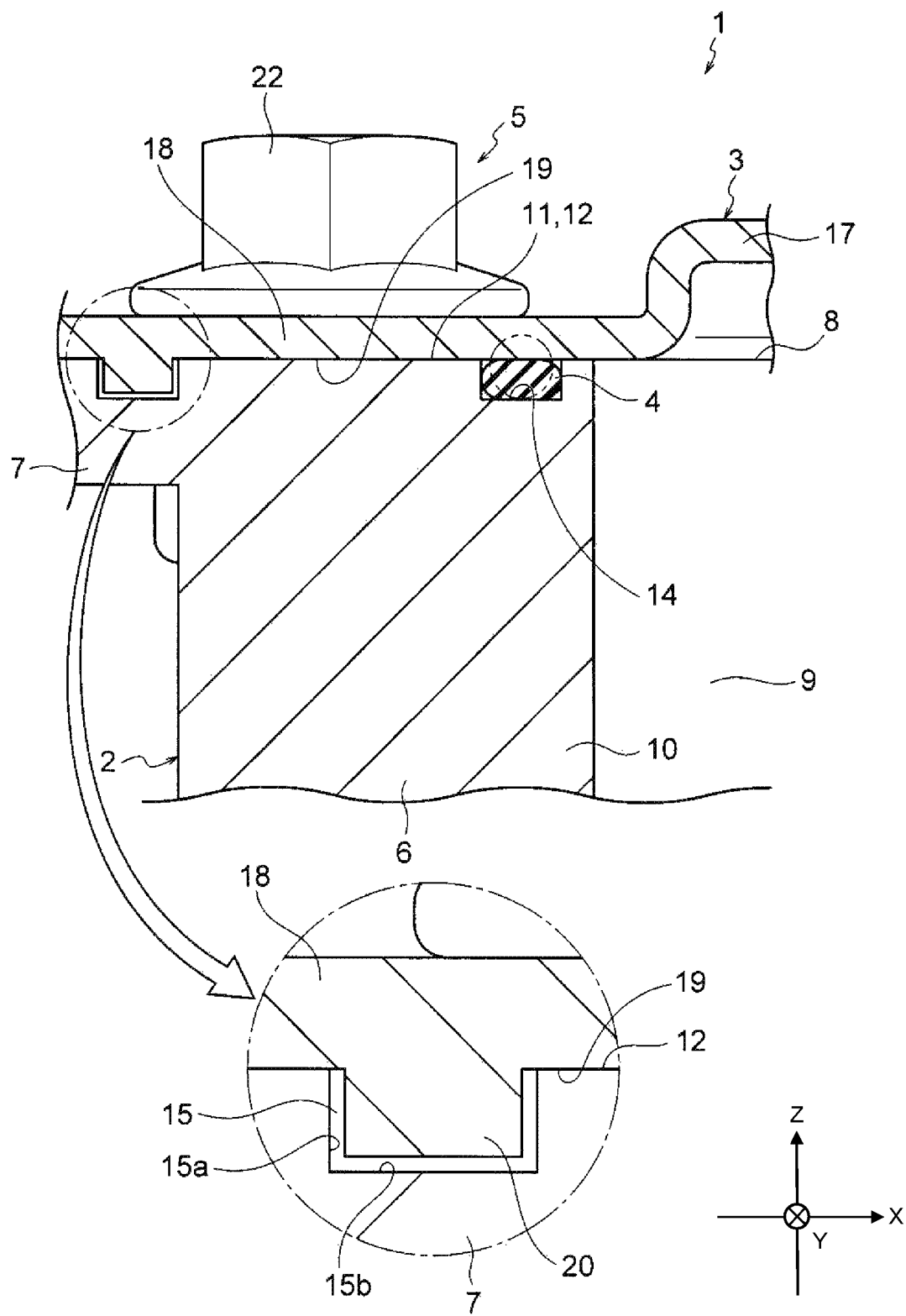
FIG. 10 is a cross-sectional view of the housing showing a second example of the cover.
Figure 11:
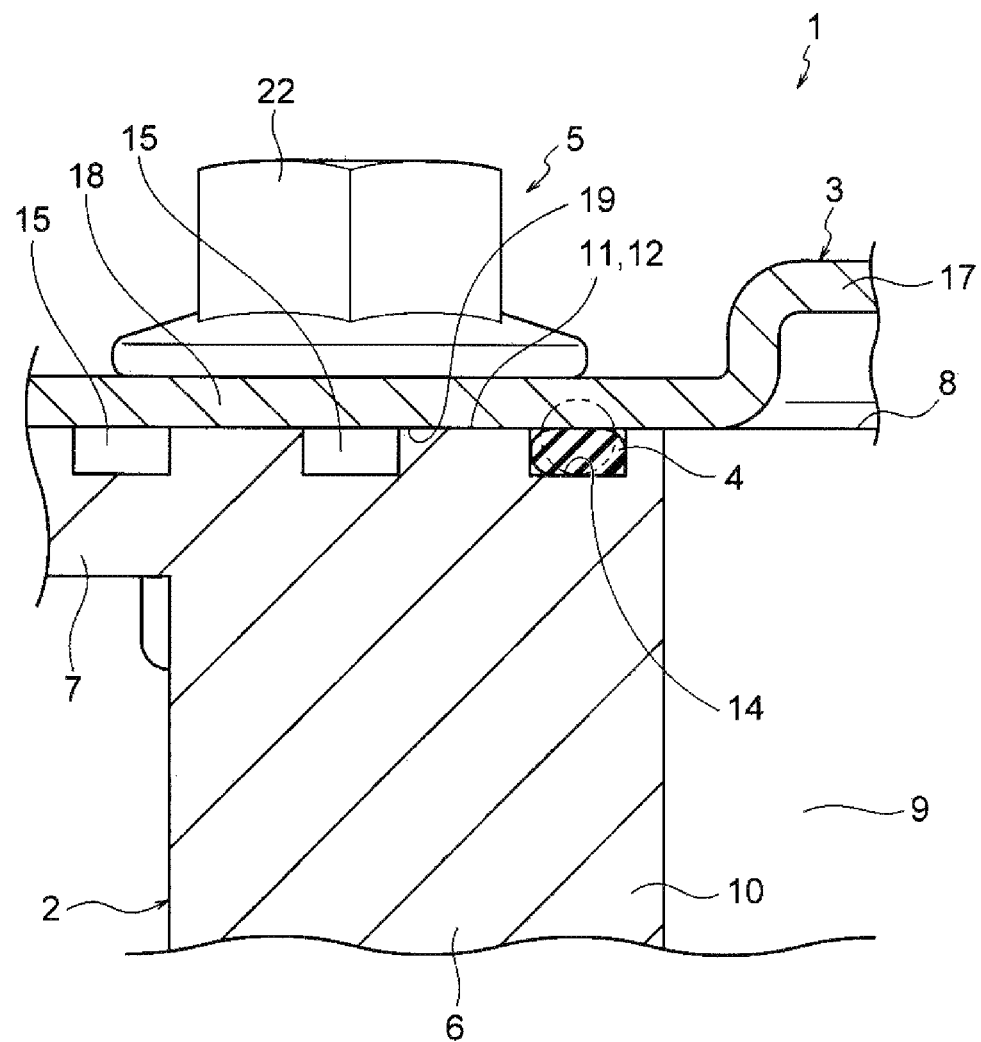
FIG. 11 is a cross-sectional view of the housing showing a sixth example of the groove portion.
Figure 11:
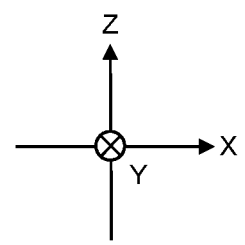
Figure 12:
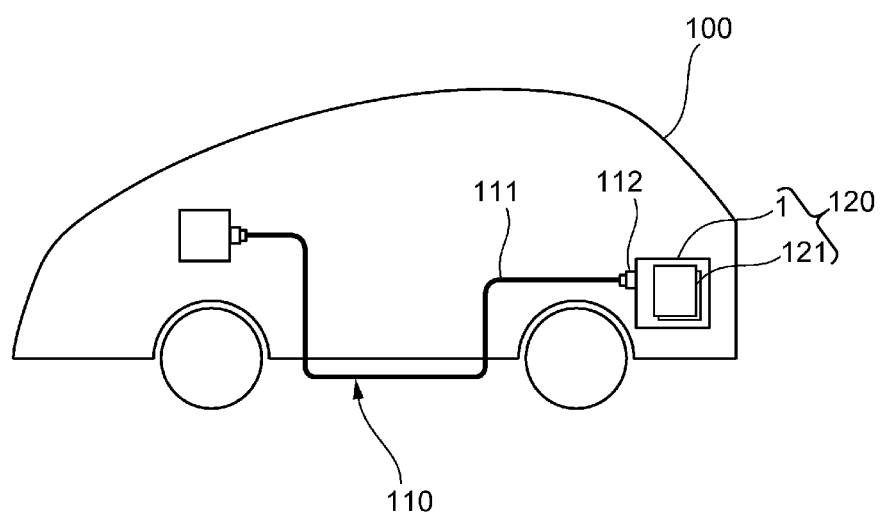
FIG. 12 is a view showing a wire harness and an electric connection box according to an embodiment of the invention.

Embodiments of the invention will be described below with reference to the drawings. FIG. 1 is a plan view showing a first example of a housing, a groove and a cover according to an embodiment of the invention. FIG. 2 is a cross-sectional view taken along a line A-A in FIG. 1 and FIG. 3 is a plan view of a case in FIG. 1. FIG. 4 is a cross-sectional view of the housing showing a second example of the groove portion, FIG. 5 is a plan view of a case in FIG. 4, FIG. 6 is a cross-sectional view of the housing showing a third example of the groove portion, FIG. 7 is a plan view of a case in FIG. 6, FIG. 8 and FIG. 9 are cross-sectional views of the housing showing a fourth example and a fifth example of the groove portion, respectively, FIG. 10 is a cross-sectional view of the housing showing a second example of the cover, and FIG. 11 is a cross-sectional view of the housing showing a sixth example of the groove portion. FIG. 12 is a view showing a wire harness and an electric connection box according to an embodiment of the invention.

In the following description, specific shapes, materials, numerical values, directions, and the like are examples for facilitating the understanding of the invention, and the invention can be appropriately modified in accordance with use, purpose, specification, and the like. In the following description of an embodiment, an X-Y direction shown in FIG. 1 to FIG. 11 corresponds to a horizontal direction, and a Z direction corresponds to a vertical direction with a Z (+) direction as an upward direction.

<Housing 1>

As shown in FIG. 12, a wire harness 110 is installed in an automobile 100. The wire harness 110 includes a wiring portion 111 and an end portion 112. An electric connection box 120 is provided in the end portion 112 of the wire harness. The electric connection box 120 includes a housing 1 as shown in, for example, FIG. 1 and a plurality of electronic components 121 (FIG. 12) that are housed in the housing 1. The electric connection box 120 according to the present embodiment is mounted at a position that is covered by water such as salt water and rain water that includes an impure part while the automobile 100 is traveling. In FIG. 1, the housing 1 includes a case 2, a cover 3, a packing 4, and four fastening members 5.

<Case 2>

In FIG. 1 to FIG. 3, the case 2 is a resin molded article that has a case body 6 and a flange portion 7, and is formed in a bottomed box shape in the present embodiment. The case body 6 has an opening 8 substantially square in a plan view, a hollow internal space 9 that communicates with the opening 8 and is located below the opening 8, four side walls 10 that form the opening 8 and the internal space 9, and a bottom wall (not shown) that is located on a lower portion of the internal space 9.

The opening 8 is formed as an insertion port of the plurality of electronic components 121. The internal space 9 is formed into a space large enough to house the plurality of electronic components 121. Each of the side walls 10 has a wall shape that has a desired thickness. An opening edge portion 11 which has a substantially rectangular frame shape in a plan view is formed at upper ends of the side walls 10 and at a periphery of the opening 8. The opening edge portion 11 is formed flat.

Fastening portions 13 are formed at four corners of the opening edge portion 11, respectively. Each of the fastening portions 13 includes an insert-molded nut (not shown). Each of the fastening portion 13 shown in FIG. 1 is a hole of the nut. Further, the cover 3 has fastening portions 21 that are formed to penetrate the cover 3 at positions corresponding to the holes of the nuts. The fastening portions 13 of the case 2 are formed at positions each straddling a part of the flange portion 7.

The flange portion 7 has a flange shape that surrounds an outer side of the opening edge portion 11. An upper surface of the flange portion 7 is formed flat. That is, the upper surface of the flange portion 7 and the opening edge portion 11 are formed on the same plane. In other words, the upper surface of the flange portion 7 and the opening edge portion 11 are formed in a shape having no step. The upper surface of the housing 1 that includes the upper surface of the flange portion 7, the opening edge portion 11 and the opening 8 constitute a first surface 12.

<First Surface 12, Packing Groove 14, Groove Portion 15>

In FIG. 1 to FIG. 3, the first surface 12 is formed into a flat surface around the opening 8 as described above. A packing groove 14 and a groove portion 15 are formed on the first surface 12. The packing groove 14 is formed as a portion for attaching the packing 4. The packing groove 14 is disposed at a position in a vicinity of the opening 8 and has a groove shape that surrounds the opening 8. "A position in a vicinity of the opening 8" is, for example, a position which is closer to the opening 8 than a center of the opening edge portion 11 between a radial inner end and a radial outer end of the opening edge portion 11. The packing groove 14 is formed in a portion where the packing 4 is kept in close contact with the case 2 and the cover 3 in a state where the packing 4 is compressed to have a substantially elliptical cross-sectional shape.

The groove portion 15 is formed on a radially outer side of the packing groove 14 on the first surface 12 of the case 2. The groove portion 15 has a groove shape capable of storing water that includes, for example, salt. The groove portion 15 is formed on a radially outer side of the four fastening portions 13 and at a position in a vicinity of the fastening portions 13 in the example of FIG. 1 to FIG. 3 (the first example of the groove portion 15). "A position in a vicinity of the fastening portions 13" is, for example, a position in the opening edge portion 11 where a shortest distance between the groove portion 15 and the fastening portions 13 is smaller than a shortest distance between the fastening portions 13 and the opening 8. The groove portion 15 has a recessed shape having a rectangular cross section, that has a groove side surface portion 15a substantially orthogonal to the first surface 12 and a bottom portion 15b substantially parallel to the first surface 12. Further, an opening width and a depth of the groove portion 15 are set to have dimensions necessary and sufficient for storing water that includes salt. Although an example in which the groove portion 15 is formed to have substantially the same cross-sectional size as the packing groove 14 is shown in FIG. 1 to FIG. 3, the invention is not limited to this example, and the packing groove 14 and the groove portion 15 may have any groove shape.

FIG. 4 and FIG. 5 show a second example of the groove portion 15. The groove portion 15 of the second example is formed at a radially inner side of the four fastening portions 13. In addition, FIG. 6 and FIG. 7 show a third example of the groove portion 15. Groove portions 15 of the third example are formed at positions at which adjacent fastening portions 13 are connected with each other, respectively. As shown in FIG. 6 and FIG. 7, the groove portions 15 of the third example are formed such that the groove portions 15 extend straight to a vicinity of the fastening portions 13. In this configuration, although the groove portions 15 are not formed in the vicinity of the fastening portions 13, there is no problem regarding infiltration of water since the water is difficult to pass through this portion due to the fastening by the fastening members 5. Further, also in the examples of FIG. 4 to FIG. 7, although the groove portion 15 is formed to have substantially the same cross-sectional size as the packing groove 14 as in the example of FIG. 1 to FIG. 3, the invention is not limited to this example.

FIG. 8 shows a fourth example of the groove portion 15. The groove portion 15 of the fourth example is formed such that the bottom portion 15b (the bottom surface) is recessed in a V-shape. The recessed shape of the bottom surface of the groove portion 15 is not limited to the V-shape. FIG. 9 shows a fifth example of the groove portion 15. The groove portion 15 of the fifth example has a through hole 16 that communicates with an outside of the housing 1 in the bottom portion 15b. The through hole 16 is formed as a portion for draining water that includes, for example, salt. FIG. 10 shows a second example of the cover 3. In an example of FIG. 10, the groove portion 15 is formed as a portion into which a protruding portion 20 (described later) formed on the cover 3 of the second example is inserted with a gap therebetween. FIG. 11 shows a sixth example of the groove portion 15. In the sixth example, two groove portions 15 are formed to be a double in the radial direction. For example, both of the groove portions 15 in the example of FIG. 1 to FIG. 3 and the groove portion 15 in the example of FIG. 6 and FIG. 7 are formed.

<Cover 3>

In FIG. 1, FIG. 2, FIG. 4, FIG. 6, and FIG. 8 to FIG. 11, the cover 3 is a resin molded article that has a cover body 17 and a collar portion 18 and is formed in a lid shape with a low ceiling in the present embodiment. The cover body 17 is formed as a portion that is located above the opening 8 of the case 2 when the cover 3 is attached to the case 2. The collar portion 18 is a plate-like portion that surrounds an edge portion of the cover body 17 and is formed as a portion that overlaps the opening edge portion 11 and the flange portion 7 of the case 2 when the cover 3 is attached to the case 2. That is, the collar portion 18 is formed as a portion which has a rectangular frame shape in a plan view. An upper surface and a lower surface of the collar portion 18 are formed flat. The lower surface of the collar portion 18 which is a flat surface constitutes a second surface 19.

<Second Surface 19>

In FIG. 2, FIG. 4, FIG. 6 and FIG. 8 to FIG. 11, the second surface 19 is in surface contact with the first surface 12 of the case 2 when the cover 3 is attached to the case 2. In addition, the second surface 19 compresses the packing 4 that is housed in the packing groove 14 of the case 2, accordingly, the packing 4 is in close contact with the case 2 and the cover 3. Further, the second surface 19 covers the groove portion 15 of the case 2.

As shown in FIG. 10, the cover 3 of the second example has the protruding portion 20 that is formed on the second surface 19. The protruding portion 20 is formed as a portion which is inserted into the groove portion 15 of the first surface 12 in the case 2 with a gap therebetween. The protruding portion 20 is effective as a portion that complicates an infiltration path of water that includes, for example, salt and makes it difficult to reach the packing 4.

The cover 3 is formed with four fastening portions 21. The fastening portions 21 of the cover 3 penetrate the collar portion 18. The fastening portions 21 of the cover 3 are formed in accordance with positions of the fastening portions 13 of the case 2. The fastening portions 21 and the fastening portions 13 are formed as portions to which the fastening members 5 are fastened.

<Packing 4 and Fastening Members 5>

In FIG. 1, FIG. 2, FIG. 4, FIG. 6, and FIG. 8 to FIG. 11, as the packing 4, a rubber packing that is circular in a cross-sectional view and annular in a plan view is adopted. The packing 4 has a function as a sealing member for blocking water. The invention is not limited to the rubber packing, and a packing of other materials, for example liquid packing may be used. However, in a case of the liquid packing, since the cover cannot be detached upon maintenance and the like, the rubber packing is more effective than the liquid packing in terms of maintainability. The fastening members 5 are members for fastening and fixing the case 2 and the cover 3, and flange bolts 22 and nuts (not shown) or the like is adopted in the present embodiment.

<Assembly of Housing 1>

A method of assembling the housing 1 will be described with reference to FIG. 1, FIG. 2 and FIG. 12. First, the plurality of electronic components 121 are housed in the internal space 9 of the case body 6, and the packing 4 is attached to the packing groove 14 of the flange portion 7. Thereafter, when the cover 3 is put on the case 2 and these are fastened by the fastening members 5, the second surface 19 of the cover 3 is in surface contact with the first surface 12 of the case 2. Further, the packing 4 is compressed and the packing 4 is in close contact with the case 2 and the cover 3 in a watertight manner. The end portion 112 of the wire harness 111 is pulled out of the housing 1. Thus, the assembly of the housing 1 is completed. When a surface contact state and a close contact state as described above are formed in a portion, this portion functions as a waterproof structure (an anticorrosion structure).

<Function and Effect of Waterproof Structure (Anticorrosion Structure)>

In FIG. 2, although the housing 1 is in a state where the first surface 12 of the case 2 and the second surface 19 of the cover 3 are in surface contact, a slight gap occurs due to some factor, and water that includes, for example, salt may infiltrate due to a capillary phenomenon and the like. According to the housing 1 of the embodiment of the invention, since the groove portion 15 is formed on the outer side of the packing groove 14, water can be stored in the groove portion 15 before reaching the packing 4, and as a result, crystallization of salt can occur in the groove portion 15 rather than in the packing 4. Therefore, deterioration of the packing 4 can be prevented, and a waterproof function (an anticorrosion function) can be maintained.

Further, according to the housing 1, since the groove portion 15 is formed on the outer side of the packing groove 14 and on the same plane as the packing groove 14, the housing 1 can be simplified and reduced in size. In addition, according to the housing 1, since a sufficient waterproof and anticorrosion function can be secured with only one packing 4, an increase in the number of components can be prevented, and assembly of the housing can be facilitated.

It goes without saying that the invention can be variously modified without departing from the spirit of the invention.

In the above embodiment, although an example is described in which the housing 1 is applied to the housing that configures an electrical connection box, the invention may be applied to, for example, a housing for salt spray evaluation test, or a housing for an electronic component storage case.

In addition, the structure of the present embodiment may be applied to a waterproof structure (an anticorrosion structure) of an electrical connection box that includes a frame and a lower cover that covers a lower opening of the frame. In this case, the same effect as described above can be obtained by forming a portion corresponding to the packing groove 14 and the groove portion 15 on a surface of the lower cover and forming a portion in surface contact with the surface on a frame side. In other words, the packing groove 14 and the groove portion 15 may be formed on the surface (the second surface) of the lower cover.

The invention claimed is:

1. A housing, comprising:
    a case that has a first surface having an opening;
    a cover that covers the opening and has a second surface that is in surface contact with the first surface; and
    an annular packing that is disposed on an outer side of the opening,
    wherein one of the first surface and the second surface has a packing groove to which the packing is attached, and a groove portion that is disposed on an outer side of the packing groove and formed on a same plane as the packing groove and
    wherein a bottom portion of the groove portion has a through hole that communicates with an outside of the housing.

2. The housing according to claim 1, further comprising:
    a plurality of fastening members that fasten the case and the cover,
    wherein each of the case and the cover has a plurality of fastening portions which are formed at positions on an outer side of the packing and the packing groove and to which the plurality of fastening members are fastened, respectively, and wherein the groove portion extends between a pair of the fastening portions, and the groove portion and the pair of the fastening portions are aligned with each other.

3. The housing according to claim 1, further comprising:

a plurality of fastening members that fasten the case and the cover, wherein each of the case and the cover has a plurality of fastening portions which are formed at positions on an outer side of the packing and the packing groove and to which the plurality of fastening members are fastened, respectively, and wherein the groove portion is disposed at a position on an inner side of the plurality of fastening portions.

4. The housing according to claim 1, further comprising:

a plurality of fastening members that fasten the case and the cover, wherein each of the case and the cover has a plurality of fastening portions which are formed at positions on an outer side of the packing and the packing groove and to which the plurality of fastening members are fastened, respectively, and wherein the groove portion is disposed at a position on an outer side and in a vicinity of the plurality of fastening portions such that the fastening members are located between the packing groove and the groove portion.

5. The housing according to claim 1, wherein a bottom surface of the groove portion has a recessed cross-sectional shape.

6. The housing according to claim 1, wherein another of the first surface and the second surface has a protruding portion configured to be inserted into the groove portion with a gap therebetween.

7. An electric connection box, comprising:

a housing according to claim 1; and a plurality of electronic components that are housed in the housing.

8. A wire harness, comprising:

a wiring portion that is installed in an automobile; and an end portion that includes the electric connection box according to claim 7.

* * * * *